United States Patent [19]

Koroncai et al.

[11] Patent Number: 4,506,320
[45] Date of Patent: Mar. 19, 1985

[54] POWER RECTIFIER ARRANGEMENT

[75] Inventors: Adam I. Koroncai, Klagenfurt, Austria; Edmund R. Poetsch, Koenigsbrunn, Fed. Rep. of Germany

[73] Assignee: Siemens Aktiengesellschaft, Berlin & Munich, Fed. Rep. of Germany

[21] Appl. No.: 462,391

[22] Filed: Jan. 31, 1983

[30] Foreign Application Priority Data

Feb. 17, 1982 [DE] Fed. Rep. of Germany ....... 3205650

[51] Int. Cl.³ ............................................. H02M 1/18
[52] U.S. Cl. .................................... 363/141; 363/144
[58] Field of Search ................. 361/386, 387, 388; 363/141, 144, 145, 146

[56] References Cited

U.S. PATENT DOCUMENTS 3,541,433  11/1970  Davis ................... 363/141
4,288,728   9/1981  Niimi et al. ........... 361/386

FOREIGN PATENT DOCUMENTS 981148  1/1965  United Kingdom ................ 363/141

Primary Examiner—Peter S. Wong
Assistant Examiner—Jeffrey Sterrett
Attorney, Agent, or Firm—Hill, Van Santen, Steadman & Simpson

[57] ABSTRACT

A power rectifier arrangement comprises at least one heat sink and at least one power rectifier. The housing floor of the power rectifier is at least partially designed as the input terminal. The secondary winding of the transformer is designed as a ribbon. The power rectifier serves as a fastening element which is screwed to the heat sink and with which the end of the ribbon is pinched between the housing floor and the heat sink. In case at least two power rectifiers are connected in parallel, the ribbon exhibits a plurality of superimposed, electrically-conductive layers corresponding to the plurality of power rectifiers and each of the electrically conductive layers is respectively connected to one power rectifier. An electrically-insulating and thermally-conductive layer is provided between two electrically-conductive layers. Advantageously, the heat sources which are formed by the transformer and the power rectifier are connected in parallel and, therefore, the heat is respectively directly dissipated to the heat sink.

3 Claims, 5 Drawing Figures

POWER RECTIFIER ARRANGEMENT

BACKGROUND OF THE INVENTION

1. Field of the Invention

The present invention relates to a power rectifier arrangement comprising a transformer, at least one heat sink and at least one power rectifier which has a terminal at the floor of a housing.

2. Description of the Prior Art

As is known in the art, a power rectifier can exhibit a semiconductor element and structural parts such as current leads, a capsule to protect against mechanical and atmospheric influences, as well as a metallic housing floor having a contact surface and, for example, a threaded stud for fastening the power rectifier to a heat sink. The inputs of the power rectifier can be designed as terminal lugs which are secured to the upper side of the capsule. The threaded stud and housing floor can serve as an output. The threaded stud and the planar annular surface of the housing floor surrounding the stud can, in approximately equal parts, assume the dissipation of the heat arising in the power rectifier.

In case the inputs of the power rectifier are connected to a transformer which produces heat, the heat is dissipated to the terminal lugs of the power rectifier. The heat of the transformer, therefore, is dissipated over the power rectifier to the heat sink. The two heat sources, transformer and power rectifier, are therefore connected in series. This can lead to undesirable overheating of the tranformer and of the power rectifier.

SUMMARY OF THE INVENTION

The object of the present invention, therefore, is to provide a power rectifier arrangement of the type generally set forth above which prevents overheating of the transformer and overheating of the power rectifier.

The above object is achieved, according to the present invention, in that the terminal at the housing floor is provided as the input terminal, that the secondary winding of the transformer is designed as a ribbon, and that the power rectifier serves as a fastening element which is screwed to the heat sink and with which the end of the ribbon is pinched between the housing floor and the heat sink.

The power rectifier advantageously comprises a threaded stud at the housing floor for screwing to the heat sink. In an advantageous embodiment of the invention, at least two power rectifiers are connected in parallel, the ribbon exhibits a plurality of superimposed, electrically-conductive first layers corresponding to the plurality of power rectifiers, each of the first layers respectively connected to one of the power rectifiers, and an electrically-insulating, thermally-conductive second layer is provided between two first layers. A power rectifier constructed in accordance with the invention has the advantage that the heat of the transformer which can arise from core and copper losses, is directly conducted to the heat sink. The electrical connection to the power rectifier is thereby simultaneously produced. Given a full load of the power rectifier, its heat loss is no longer emitted to the secondary winding of the transformer but, rather, is emitted to the heat sink. The heat sources, transformer and power rectifier, therefore, are connected in parallel. It is further advantageous that a skin effect is avoided, whereby an additional heat generation due to too high a current density in the transformer, is prevented. By dividing the ribbon into different layers and by connecting a respective electrically-conductive layer to a power rectifier, each individual ribbon is separately rectified and a current balance is thereby achieved.

BRIEF DESCRIPTION OF THE DRAWING

Other objects, features and advantages of the invention, its organization, construction and operation will be best understood from the following detailed description, taken in conjunction with the accompanying drawing, on which.

DESCRIPTION OF THE PREFERRED EMBODIMENTS

Figure 1:
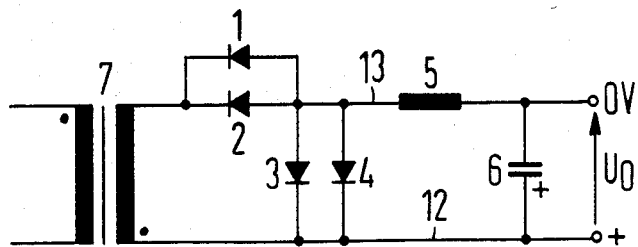
FIG. 1 is a schematic circuit diagram of a power rectifier arrangement constructed in accordance with the present invention.

The power rectifier arrangement illustrated in FIG. 1 comprises a transformer 7, four power rectifiers 1, 2, 3 and 4, and inductive load 5 and a capacitive load 6. The power rectifiers 1, 2, 3, 4 are connected as a full-wave rectifier circuit to the secondary winding of the transformer 7, whereby respectively two power rectifiers 1, 2 and 3, 4 are connected in parallel to one another. The cathodes of the power rectifiers 1, 2, 3, 4 are connected to the transformer 7. The anodes of all power rectifiers 1, 2, 3, 4 are connected to the inductance 5. The capacitance 6 is disposed in parallel to the output of the circuit. The junction of the inductance 5 and of the capacitance 6 lies at zero volts.

Figure 2:
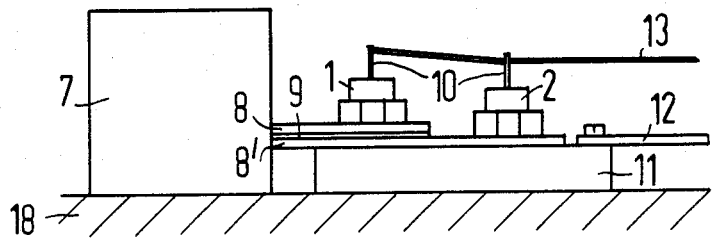
FIG. 2 is a side elevation of a circuit arrangement constructed in accordance with FIG. 1.
Figure 3:
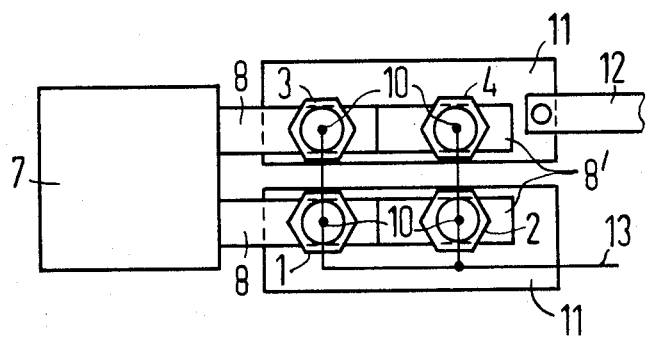
FIG. 3—is a plan view of the circuit arrangement of FIG. 2.

The power rectifiers 1, 2, 3, 4 in FIGS. 2 and 3 exhibit a housing protecting against mechanical and atmospheric influences and having a housing floor which is provided with an annular contact surface and a threaded stud. Two respective power rectifiers 1, 2, 3, 4 are screwed into two heat sinks 11. The contact surface at the housing floor and the threaded stud serve as a cathode. Terminal lugs 10 are attached to the upper side of the housing as anodes. The heat sink 11 and the transformer 7 are disposed on a cooled bottom plate 18. The secondary winding of the transformer 7 leads out of the transformer. The winding comprises a ribbon 8, 8', 9 which consists of two first layers 8, 8' which are electrically conductive and a second layer 9 which is electrically insulating and thermally conductive. Such a ribbon is known, for example, under the tradename Kapton ribbon.

The ribbons 8, 8' are respectively pinched between the housing floor of the power rectifiers 1, 2, 3, 4 and the two heat sinks 11. The power rectifiers 1, 2, 3, 4 thereby serve as fastening elements in the manner of a screw. The inputs of all power rectifiers 1, 2, 3, 4 are thus directly connected to the secondary winding of the transformer 7. The connection of the terminal lugs 10 to the inductance 5 occurs over a first conductor 13. The electrically-conductive connection from the threaded studs to the output of the circuit arrangement occurs by way of the heat sink 11 and a further conductor 12 which is electrically connected to the heat sink in which the power rectifiers 3, 4 are screwed.

The thickness of the electrically-conductive layers 8, 8' depends on the penetration depth of the current. It is dimensioned such that a skin effect is prevented. Each electrically conductive layer 8, 8' is connected to a respective power rectifier 1, 2, 3, 4. This occurs in that the ribbon 8, 8', 9 is pinched at the power rectifiers 1, 3 which are closest to the transformer 7, together with all layers 8, 8', 9. By so doing, an electrically conductive connection is provided exclusively over the uppermost layer 8 between the transformer 7 and the power rectifiers 1, 3. The dissipation of the heat of the power rectifiers 1, 3, however, occurs over all layers of the ribbon 8, 8', 9 to the heat sink 11. A large portion of the heat of the transformer 7 is likewise dissipated over all layers of the ribbon 8, 8', 9 to the heat sink. For the purpose of connecting the further power rectifiers 2, 4, the upper electrically-conductive layer 8 and the second layer 9 are removed. Therewith, an electrically-conductive connection exists between the transformer 7 and the power rectifiers 2, 4 only over the lower electrically conductive layer 8'. The dissipation of the heat likewise occurs over the layer 8'.

Figure 4:
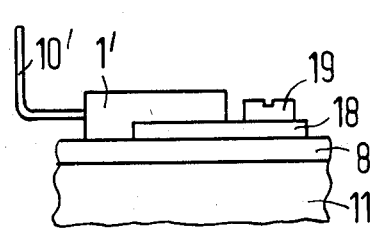
FIG. 4 is a front view of a further circuit arrangement constructed in accordance with the invention.

FIG. 4 illustrates a further exemplary view of a circuit arrangement having a power rectifier 1'. The housing of the power rectifier 1' comprises a synthetic material which is cast around the semiconductor elements. The housing floor of the power rectifier 1' comprises, partly, a metal plate 21 which serves as the input terminal. The power rectifier 1' is screwed to the heat sink 11 by a screw 20 which is conducted through an opening in the metal plate 21. The ribbon 8 is pinched between the housing floor and the heat sink 11. The terminal lugs 10' are conducted laterally out of the housing of the power rectifier 1'.

Figure 5:
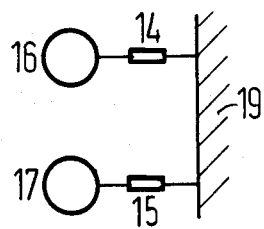
FIG. 5 is an equivalent circuit diagram of the circuit arrangement according to FIGS. 2 and 4 for illustrating heat flow.

FIG. 5 illustrates a heat source 16 which is formed by the transformer 7. The source 16 is connected to a heat sink 19 by way of a thermal resistor 14. A heat source 17, which is formed by the power rectifiers 1, 2, 3, 4 is connected to the heat sink 19 over a further thermal resistor 15. The thermal resistors 14, 15 are thus connected in parallel. They are respectively loaded only with the heat flows from the allocated heat sources 16 or, respectively, 17, to the heat sink 19. The amounts of heat arising in the thermal resistors 14 and 15 correspond to the heat loss of the transformer 7 or, respectively, of the power rectifiers 1, 2, 3, 4. FIG. 4 represents an electrical equivalent diagram illustrating the heat flow.

Although we have described our invention by reference to particular illustrative embodiments thereof, many changes and modifications of the invention may become apparent to those skilled in the art without departing from the spirit and scope thereof. We therefore intend to include within the patent warranted hereon all such changes and modifications as may reasonably and properly be included within the scope of out contribution to the art.

We claim:

1. A power rectifier arrangement comprising: at least one rectifier unit including a housing, a floor in said housing, and an input terminal extending from said floor; heat sink means including at least one bore for receiving said input terminal; a cooled plate carrying said heat sink means; and a transformer mounted on said cooled plate and including a primary winding, and a secondary winding connected to said at least one rectifier unit, said secondary including a conductive ribbon structure comprising a plurality of electrically conductive layers each having a predetermined thickness dependent on the current penetration depth in order to prevent skin effect, which are pinched between said floor and said heat sink means when said input terminal is received in said bore.

2. The power rectifier arrangement of claim 1, wherein:
said input terminal comprises a threaded stud; and
said bore is a threaded bore for threadedly receiving said threaded stud.

3. The power rectifier arrangement of claim 1, wherein:
said at least one rectifier unit comprises at least two rectifiers connected in parallel; and
said ribbon structure comprises a plurality of superposed electrically conductive layers equal in number to the number of said rectifiers and electrically insulating thermally conductive layers separating said electrically conductive layers.

* * * * *